(12) United States Patent
Odaohhara

(10) Patent No.: US 6,829,545 B2
(45) Date of Patent: Dec. 7, 2004

(54) METHOD OF CALCULATING CAPACITY OF INTELLIGENT BATTERY, INTELLIGENT BATTERY AND PORTABLE ELECTRONIC DEVICE

(75) Inventor: Shigefumi Odaohhara, Yamato (JP)

(73) Assignee: International Business Machines Corporation, Armonk, NY (US)

( * ) Notice: Subject to any disclaimer, the term of this patent is extended or adjusted under 35 U.S.C. 154(b) by 18 days.

(21) Appl. No.: 10/003,200

(22) Filed: Nov. 15, 2001

(65) Prior Publication Data

US 2002/0087278 A1 Jul. 4, 2002

(30) Foreign Application Priority Data

Nov. 15, 2000 (JP) ........................................ 2000-347947

(51) Int. Cl.[7] .......................... G06F 19/00; G01R 31/36
(52) U.S. Cl. ........................................................ 702/63
(58) Field of Search .............................. 702/63, 14, 17; 320/134, 106, 2, 13; 340/636, 637, 634; 701/22; 429/331; 318/139, 387, 587; 235/1 D; 369/279; 307/64; 396/229; 334/468

(56) References Cited

U.S. PATENT DOCUMENTS

| 5,892,346 A | * | 4/1999 | Moroto et al. | .............. 318/587 |
| 5,955,869 A | | 9/1999 | Rathmann | .................... 320/132 |
| 6,295,002 B1 | * | 9/2001 | Fukuda | .................... 340/636.1 |

FOREIGN PATENT DOCUMENTS

| EP | 0592965 | 4/1994 | |
| JP | 06-124146 | 5/1994 | ............. G06F/1/28 |
| JP | 10-509579 | 9/1998 | ............. H02J/7/04 |
| JP | 194456 | 7/2002 | |

OTHER PUBLICATIONS

Abstract/Zusammenfassung/Abrege, No. 01309489.1.

* cited by examiner

*Primary Examiner*—John Barlow
*Assistant Examiner*—Tung Lau
(74) *Attorney, Agent, or Firm*—Daniel E. McConnell

(57) ABSTRACT

A method of calculating capacity of an intelligent battery is provided for, whereby an intelligent battery and a portable electronic device are capable of allowing for power consumption by a minute current undetectable by a conventional circuit without any special cost required so as to consequently allow an error of capacity data to be smaller.

6 Claims, 4 Drawing Sheets

Fig. 4

| Bit | Mode | Description | |
|---|---|---|---|
| Bits 15 to 14 | Power mode | 00: | Normal operational mode |
| | | 01: | N/A |
| | | 10: | Reconnection |
| | | 11: | Soft-off mode |
| Bits 13 to 0 | Consumption electric current value | Input: | Positive integer |
| | | Unit: | 0.1 mA |
| | | Range: | 0 mA to 1638.3 mA |

METHOD OF CALCULATING CAPACITY OF INTELLIGENT BATTERY, INTELLIGENT BATTERY AND PORTABLE ELECTRONIC DEVICE

BACKGROUND OF THE INVENTION

1. Field of the Invention

The present invention relates to a battery capacity calculation method of an intelligent battery, the intelligent battery and a portable electronic device at least equipped with a current measurement circuit and calculating battery capacity based on a current value measured thereon.

2. Description of the Related Art

Conventionally, various intelligent batteries have been known, which are equipped with a CPU, a timer, a current measurement circuit, a voltage measurement circuit, a thermal measurement circuit and so on and always monitoring a consumption current (a current flowing from a battery) and a charging current (a current flowing into the battery) in modes by using these circuits so as to always grasp capacity data. Such an intelligent battery is used as a power supply of a notebook-sized PC for instance.

In recent years, it has become necessary in the notebook-sized PC to add a soft-off state to power supply modes in supporting ACPI proposed by Microsoft Corp. In this soft-off state, while a current of approximately 3 to 4 mA that is a minute current flows, it has been difficult to correctly detect the current value on the current measurement circuit of the conventional intelligent batteries.

As for problems of inability to correctly detect the current value, characteristics such as a voltage offset, a temperature drift and so on of operational amplifiers comprising the current measurement circuit can be named. In addition, there has been a problem that a circuit of high performance cannot be incorporated since it is necessary to mount a CPU and other circuits in a battery pack and there is only limited space. Furthermore, there has also been a problem that the operational amplifiers of high precision are expensive and it is costly to configure a circuit of high performance capable of detecting such a minute current.

Thus, problems that the current value could be read in spite of no current actually flowing, and the current value could not be read in spite of a current flowing have occurred, to name a few. Consequently, a problem that the longer the soft-off state is, the greater an error of the capacity data managed in the intelligent battery becomes has occurred.

SUMMARY OF THE INVENTION

An object of the present invention is to provide a method of calculating capacity of the intelligent battery, the intelligent battery and portable electronic device that solve the above-mentioned problems and are capable of allowing for power consumption by a minute current undetectable by a conventional circuit without any special cost required so as to consequently allow the error of the capacity data to be smaller.

A method of calculating capacity of an intelligent battery of the present invention relates to a method of calculating capacity of the intelligent battery at least equipped with a current measurement circuit to measure an electric current value on which calculation of battery capacity is based. By the method of calculating capacity of the intelligent battery of the present invention:

(1) when a system using the intelligent battery shifts from an normal operational mode to a low electric power consumption mode, the system sends a notice to the battery that it shifts to the low electric power consumption mode and also sends a consumption electric current value or a consumption electric power value in the low electric power consumption mode unique to the system;

(2) the intelligent battery performs subtraction of capacity data based on the received consumption electric current value or consumption electric power value in the low electric power consumption mode, and disables capacity calculation by the current measurement circuit on the other hand;

(3) when the system using the intelligent battery shifts from the low electric power consumption mode to the normal operational mode, the system sends a notice to the battery that it shifts to the normal operational mode and also stops the subtraction of capacity data based on the consumption electric current value or consumption electric power value in the low electric power consumption mode, and enables capacity calculation by the current measurement circuit on the other hand.

In the present invention, the capacity data in the low electric power consumption mode such as during a soft-off mode is calculated, rather than capacity calculation based on the current value measured by the current measurement circuit of the battery itself, based on the capacity data acquired by multiplying the consumption electric current value in the low electric power consumption mode acquired in advance by the length of time and voltage for the mode to continue or the capacity data acquired by multiplying the consumption electric power value in the low electric power consumption mode acquired in advance by the length of time for the mode to continue, so that the battery capacity in the low electric power consumption mode can be correctly calculated and the error of the acquired capacity data can be made smaller.

As preferred embodiments of the present invention, there is an aspect in which the low electric power consumption mode is a soft-off state or a suspended state in ACPI, and a form wherein the intelligent battery is SBS-compliant and a notice of the mode shifting from the system to the battery and a notice of the consumption electric current value or consumption electric power value in the low electric power consumption mode are sent by defining OptionalMfgFunction 1 of SBS. In either case, the method of calculating capacity of the intelligent battery of the present invention can be easily performed.

Another preferred embodiment of the present invention is handling of the intelligent battery in the case where it is drawn out of the system during the low electric power consumption mode. The following shows two preferred examples. In either case, the method of calculating capacity of the intelligent battery of the present invention can be performed in a preferable manner even if the battery is drawn out of the system.

As a first method, in the low electric power consumption mode:

(1) on detecting that the intelligent battery is drawn out of the system, the subtraction of capacity data based on the received consumption electric current value or consumption electric power value in the low electric power consumption mode is stopped;

(2) next, on detecting that the intelligent battery is connected to the system, the intelligent battery counts time from the connection; and (3) when the system using the intelligent battery shifts from the low electric power consumption mode to the normal operational mode:

(a) the system sends a notice to the effect that it is reconnected to the intelligent battery and also sends the consumption electric current value or consumption electric power value in the low electric power consumption mode unique to the system;

(b) it calculates capacity to be subtracted from the reconnection from the received consumption electric current value or consumption electric power value and the counted time, and subtracts the calculated capacity to be subtracted from the capacity data; and (4) next, the system sends a notice to the intelligent battery to the effect that it shifts to the normal operational mode and also stops the subtraction of capacity data based on the consumption electric current value or consumption electric power value in the low electric power consumption mode, and enables capacity calculation by the current measurement circuit on the other hand.

As a second method, in the low electric power consumption mode:

(1) on detecting that the intelligent battery is drawn out of the system, the intelligent battery stops the subtraction of capacity data based on the received consumption electric current value or consumption electric power value in the low electric power consumption mode;

(2) next, on detecting that the intelligent battery is connected to the system:

(a) the system recognizing the connection sends a notice to the effect that it is reconnected to the intelligent battery and also sends the consumption electric current value or consumption electric power value in the low electric power consumption mode unique to the system;

(b) the intelligent battery resumes subtraction of capacity data based on the received consumption electric current value or consumption electric power value in the low electric power consumption mode, and disables capacity calculation by the current measurement circuit on the other hand;

(3) when the system using the intelligent battery shifts from the low electric power consumption mode to the normal operational mode, the system sends a notice to the battery that it shifts to the normal operational mode and also stops the subtraction of capacity data based on the consumption electric current value or consumption electric power value in the low electric power consumption mode, and enables capacity calculation by the current measurement circuit on the other hand.

Moreover, another example of the method of calculating capacity of the intelligent battery of the present invention is characterized by including the steps of:

(1) on a shift of the system from the normal operational mode to the low electric power consumption mode and thereafter to the normal operational mode, calculating on the system side consumption battery capacity data assumed to have been spent during the low electric power consumption mode based on the consumption electric current value or consumption electric power value in the low electric power consumption mode unique to the system.

(2) sending consumption battery capacity data from the system side to the above described intelligent battery side;

(3) on the above described intelligent battery side, calculating current battery capacity based on the above described consumption battery capacity data.

Furthermore, the intelligent battery equipped with the above-mentioned capacity calculation method and a personal computer equipped with the intelligent battery are preferable since they can make the error of the battery capacity data smaller.

BRIEF DESCRIPTION OF THE DRAWINGS

Other aspects, features, and advantages of the present invention will become more fully apparent from the following detailed description, the appended claims, and the accompanying drawings in which:

FIG. 4 is a drawing showing an example of definition of OptionalMfgFunction 1 utilized in the present invention.

DETAILED DESCRIPTION

Figure 1:
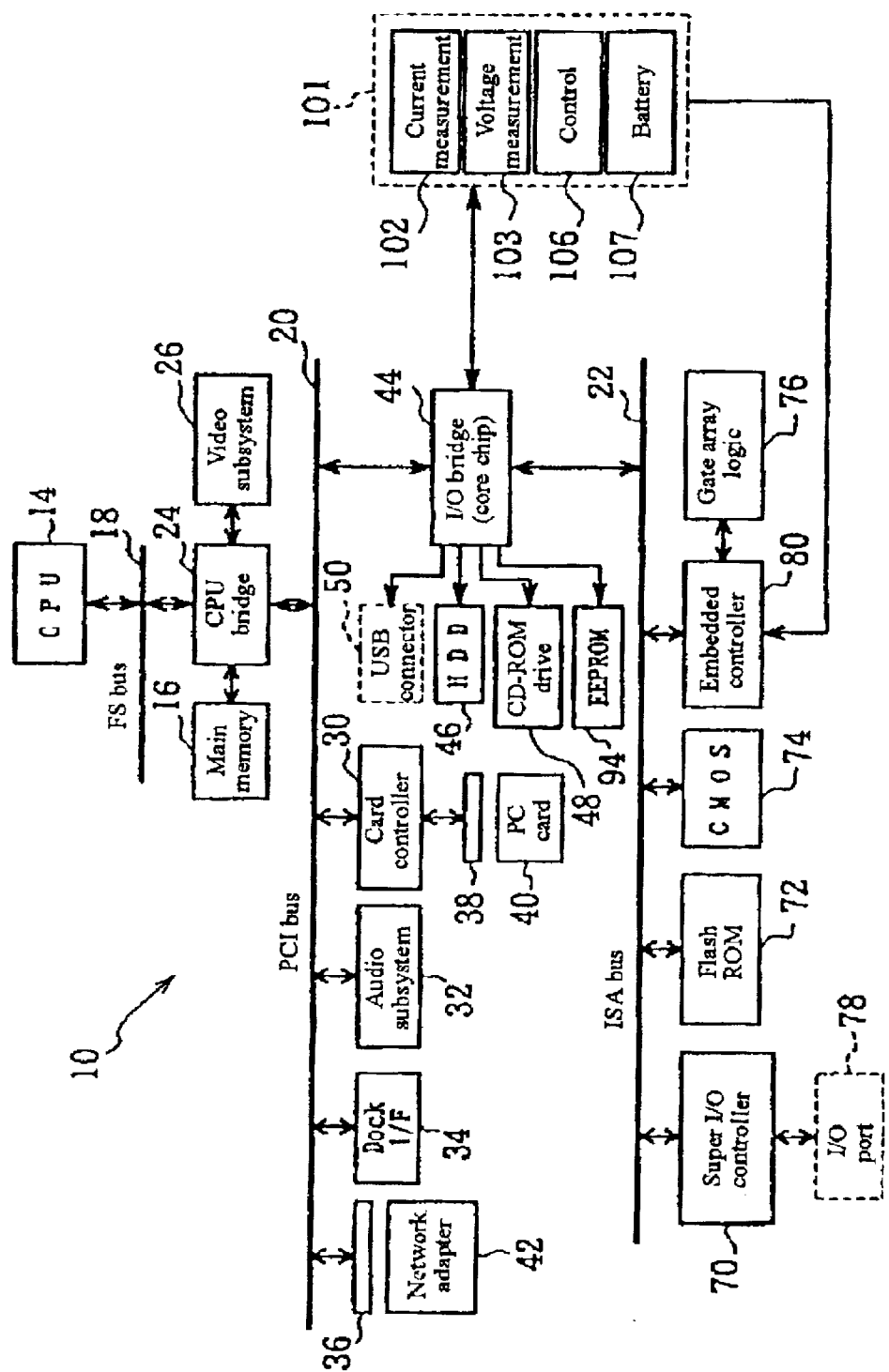
FIG. 1 is a block diagram showing a hardware configuration for respective subsystems of a computer system comprised of a typical personal computer (PC) equipped with an intelligent battery of the present invention.

FIG. 1 is a block diagram showing hardware configuration of a computer system 10 comprised of a typical personal computer (PC) equipped with an intelligent battery of the present invention for each of subsystems. In an example shown in FIG. 1, a PC equipped with the intelligent battery of the present invention is exemplified by a notebook-sized PC 12 (see FIG. 2) that is compliant with the OADG(PC Open Architecture Developers Group) specifications and mounts "Windows 98, ME or 2000" of Microsoft Corp., USA or "OS/2" of IBM, USA for its operating system. Sections of the computer system 10 will be described hereafter.

A CPU 14 as brains of the entire computer system 10 runs various programs under control of the OS. The CPU 14 can be, for instance, a CPU chip "Pentium," "MMX technology Pentium," or "Pentium Pro," of Intel Corp., USA or a CPU of another vendor such as AMD and so on, or "Power PC" of IBM. The CPU 14 is configured by including L2 (level 2)-cache that is a high-speed operation memory for reducing total access time to a main memory 16 by temporarily storing very limited codes and data frequently accessed. The L2-cache is generally comprised of SRAM (static RAM) chips, and its storage capacity is 512 kB or more for instance.

The CPU 14 is interconnected with each of hardware components described later via three-level hierarchy of buses, that is, an FS (Front Side) bus 18 as a processor-direct-coupled bus directly connected to its own external pin, a PCI (Peripheral Component Interconnect) bus 20 as a bus for high-speed I/O placement and an ISA (Industry Standard Architecture) bus 22 for low-speed I/O placement.

The FSB 18 and the PCI bus 20 are generally linked by a CPU bridge (host-PCI bridge) 24 called a memory/PCI control chip. The CPU bridge 24 of this embodiment is configured by including a memory controller function for controlling access operation to the main memory 16, a data buffer for absorbing a difference in data transfer speed between the FSB 18 and the PCI bus 20 and so on, for which 440BX of Intel Corp. and so on can be used for instance.

The main memory 16 is a writable memory utilized as a read area for an executable program of the CPU 14 or as a work area for writing process data of the program. The main memory 16 is generally comprised of a plurality of DRAM (Dynamic RAM) chips, equipped with 32 MB as a standard and is extendable to 256 MB for instance. In recent years, DRAMs are changing to a high-speed page DRAM, an EDO DRAM, a synchronous DRAM (SDRAM), a burst EDO DRAM, an RDRAM and so on in order to meet demands for higher speed.

Moreover, the executable programs referred to here include OS such as Windows 98, various device drivers for performing hardware operation of peripherals, application programs for specific business, firmware such as BIOS (Basic Input/Output System: a program for controlling input-output operations of a keyboard, a floppy disk drive and so on) stored in a flash ROM 72 and so on.

The PCI bus 20 is a type of a bus capable of relatively fast data transfer (for instance, bus width 32/64 bits, maximum operation frequency 33/66/100 MHz, maximum data transfer rate 132/264 MBps) to which relatively fast driving PCI devices such as a card bus controller 30 are connected. Moreover, a PCI architecture originates from a proposal of Intel Corp., USA and it implements a so-called PnP (Plug and Play) function.

Figure 2:
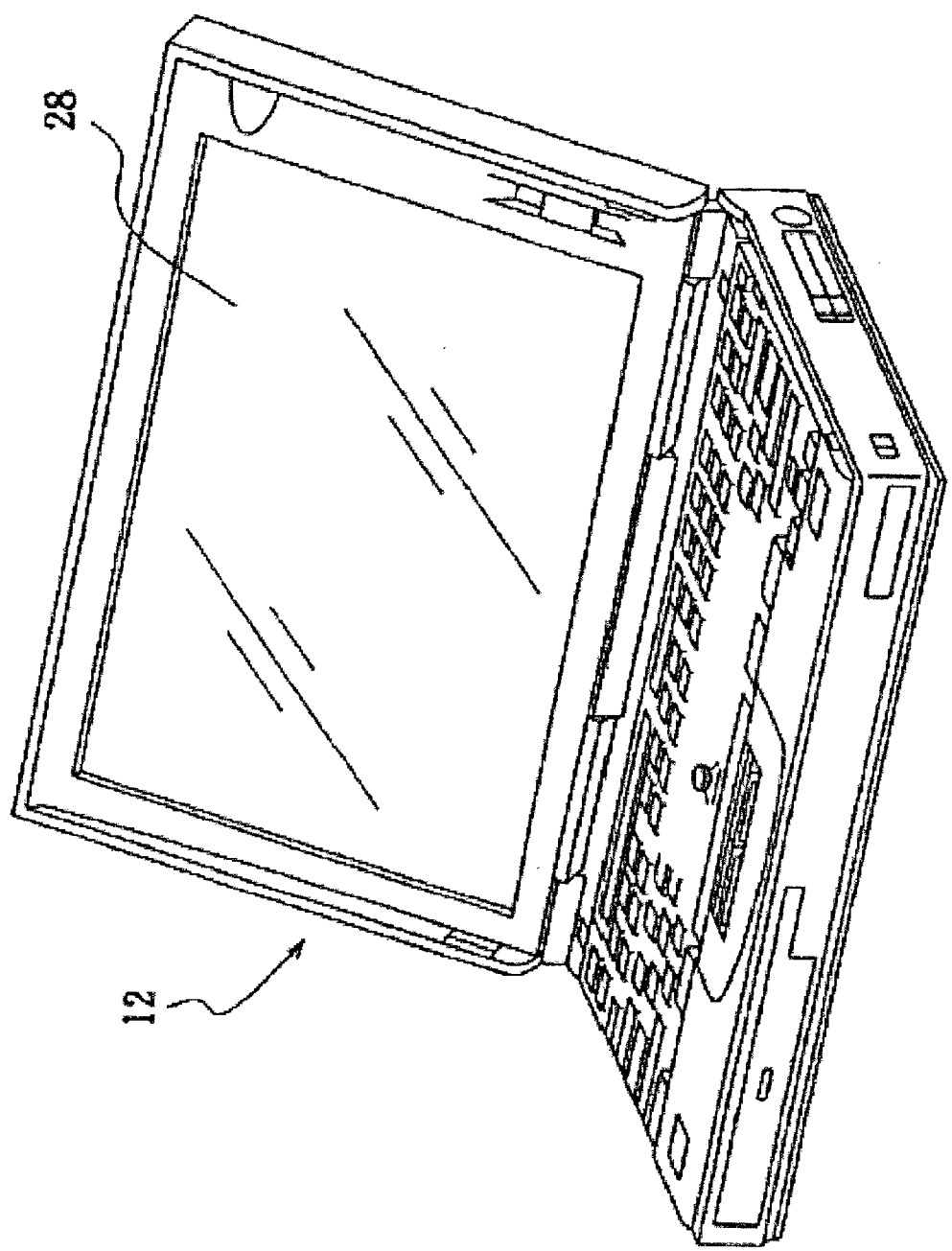
FIG. 2 is a drawing showing a appearance of the computer system shown in FIG. 1.

A video subsystem 26 is a subsystem for implementing functions related to video, and it includes a video controller for actually processing graphics-drawing instructions from the CPU 14, writing the processed graphics-drawing information into video memory (VRAM) once and also reading the graphics-drawing information from the VRAM to output it as graphics-drawing data to a liquid crystal display (LCD) 28 (see FIG. 2). In addition, the video controller can convert digital video signals into analog video signals by an attached digital-analog converter (DAC). The analog video signals are outputted to a CRT port (unillustrated) via a signal line.

Moreover, the PCI bus 20 is connected with the card bus controller 30, an audio subsystem 32, a docking station interface (Dock I/F) 34 and a mini PCI slot 36 respectively. The card bus controller 30 is a dedicated controller for directly connecting bus signals of the PCI bus 20 to an interface connector (card bus) of a PCI card bus slot 38. The card bus slot 38 has a PC card 40 loaded, which is placed on a wall of the PC 12 main unit and compliant with the specifications (for instance, "PC Card Standard 95") established by PCMCIA (Personal Computer Memory Association)/JEIDA (Japan Electronic Industry Development Association).

A Dock I/F 34 is hardware for connecting the PC 12 and a docking station (unillustrated), where if the PC 12 is set on the docking station, an internal bus of the docking station is connected to the Dock I/F 34 and various hardware components connected to the internal bus of the docking station are connected to the PCI bus 20 via the Dock I/F 34. In addition, the mini PCI slot 36 is connected with a network adapter 42 for connecting the computer system 10 to a network (such as LAN).

The PCI bus 20 and an ISA bus 22 are interconnected by an I/O bridge 44. The I/O bridge 44 has a bridge function for the PCI bus 20 and an ISA bus 22, a DMA controller function, a programmable interrupt controller (PIC) function and a programmable interval timer (PIT) function, an IDE (Integrated Drive Electronics) interface function, a USB (Universal Serial Bus) function and an SMB (System Management Bus) interface function, and has a built-in real time clock (RTC) and is capable of using a device (core chip) such as PIIX4 of Intel Corp.

Moreover, the DMA controller function is a function for transferring data between a peripheral (for instance, FDD) and the main memory 16 without involvement by the CPU 14. In addition, the PIC function is a function for running a predetermined program (an interrupt handler) by responding to an interrupt request (IRQ) from a peripheral. In addition, the PIT function is a function for generating timer signals according to predetermined cycle, which generation cycle is programmable.

In addition, an IDE interface implemented by the IDE interface function is connected with an IDE hard disk drive (HDD) 46 and also an IDE CD-ROM drive 48 via ATAPI (AT Attachment Packet Interface) connection. Moreover, another type of IDE apparatus such as a DVD (Digital Video Disc or Digital Versatile Disc) drive can be connected instead of the IDE CD-ROM drive 48. External storages such as the HDD 46 and the CD-ROM drive 48 are stored in a storage place called a "media bay" or a "device bay" in the PC 21 main unit for instance. Such standard external storages may also be mounted in a manner replaceable with other apparatuses such as an FDD and a battery pack and exclusive.

Furthermore, the I/O bridge 44 has a USB port provided, which is connected for instance to a USB connector 50 possibly provided on a wall of the PC 12 main unit. The USB supports a function of plugging in and unplugging a new peripheral (USB device) with the power on (hot plugging function) and a function of automatically recognizing a newly connected peripheral and resetting system configuration (plug and play function). A maximum of 63 USB devices can have daisy connections with one USB port. There are various examples of USB devices, such as a keyboard, a mouse, a joystick, a scanner, a printer, a modem, a display monitor and a tablet. In addition, the I/O bridge 44 is connected to an EEPROM 94 via an SM bus. The EEPROM 94 is a memory for retaining a password, a supervisor password, a product serial number and so on registered by a user and is nonvolatile and capable of electrically rewriting stored contents.

Furthermore, the I/O bridge 44 is connected to a power circuit 101. The power circuit 101 has a current measurement circuit 102, a voltage measurement circuit 103, a control circuit 106 and a battery 107. This power circuit 101 is an intelligent battery for implementing a method of calculating capacity of an intelligent battery of the present invention. Moreover, the power supply 107 is configured for instance by three lithium ion batteries of rated voltage 4.2 V in series.

On the other hand, inside the core chip comprising the I/O bridge 44, there are an internal register for managing a power state of the computer system 10 and a logic (state machine) for managing a power state of the computer system 10 including operations of the internal register provided.

The above logic transmits and receives various signals to and from the power circuit 101, and recognizes an actual state of feeding from the power circuit 101 to the computer system 10 by the transmission and reception of the signals, where the power circuit 101 controls supply of power to the computer system 10 according to instructions from the above logic.

The ISA bus 22 is a bus of a lower data transfer rate than the PCI bus 20 (for instance, bus width 16 bits, maximum data transfer rate 4 MBps), and is used for connecting with peripherals operating at a relatively low speed such as a keyboard and a mouse controller in addition to the flash ROM 72 comprised of a super I/O controller 70, an EEPROM and so on, a CMOS 74, and an embedded controller 80 connected to a gate array logic 76 (all unillustrated).

The super I/O controller 70 is connected with an I/O port 78. The super I/O controller 70 controls driving of the floppy disk drive (FDD), input-output of parallel data via a parallel port (PIO) and input-output of serial data via a serial port (SIO).

The flash ROM 72 is a memory for retaining programs such as BIOS, and is nonvolatile and capable of electrically rewriting stored contents. In addition, a CMOS 74 is configured by connecting a volatile semiconductor memory to a backup power supply and functions as nonvolatile and high-speed means for storage.

The embedded controller 80 controls the unillustrated keyboard and also performs part of a power management function by a built-in power management controller (hereafter, "PMC") in synergy with the gate array logic 76.

In addition, this embedded controller 80 controls the power supplied to the respective system components. In the preferred embodiment of the present invention, while the power is supplied to all of the system components shown in FIG. 1 in the normal operational mode, it controls it so that the power is supplied to a DC/DC 66, a battery switching circuit 68, the embedded controller 80, the gate array 76, the CMOS 74, the I/O bridge 44, the network adapter 42 and a network connector 36 but supply of the power to other components is stopped.

Figure 3:
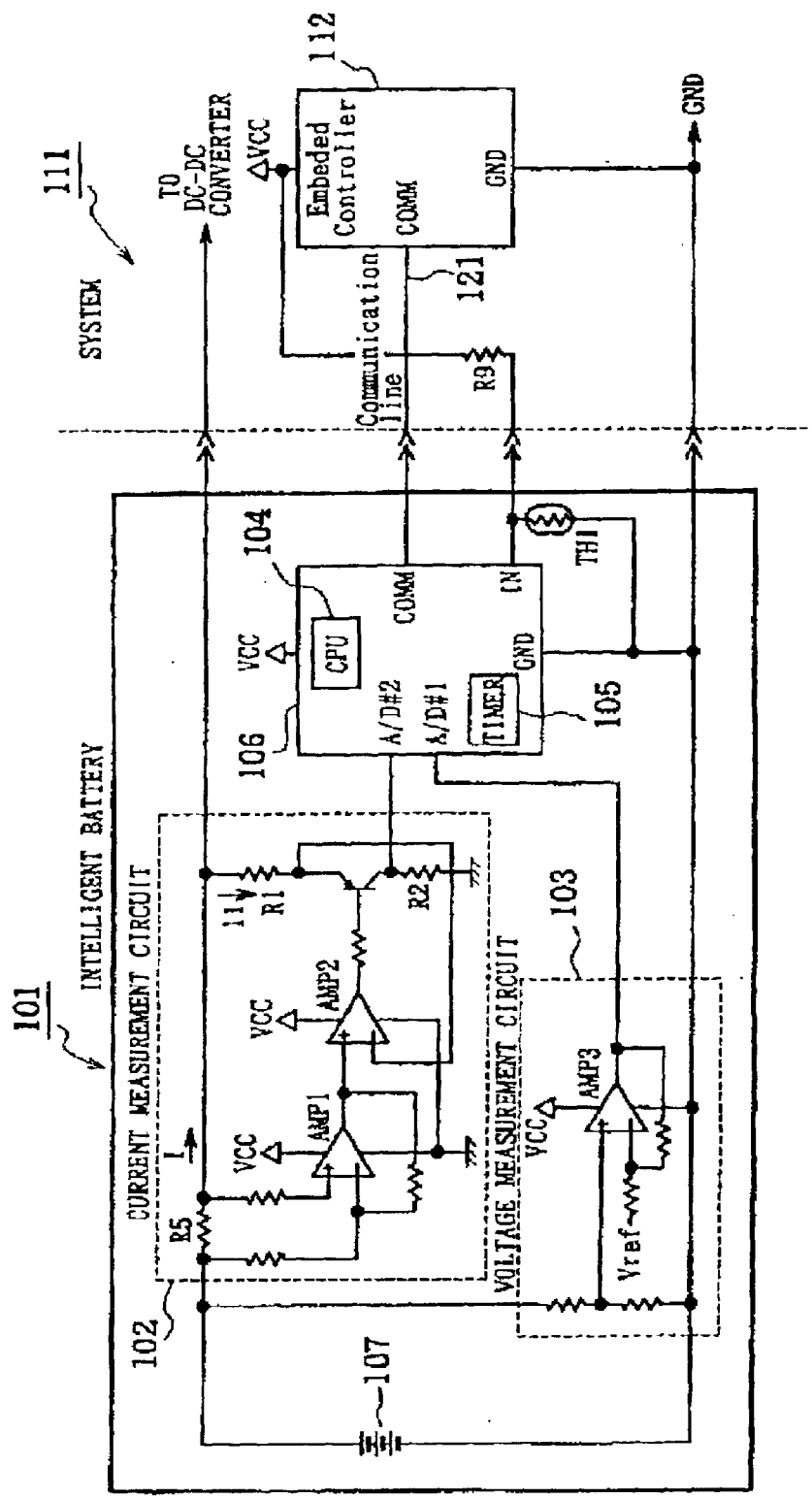
FIG. 3 is a diagram showing a circuit configuration of the intelligent battery and a part of the system for implementing a method of calculating capacity of the intelligent battery of the present invention.

Next, details of the method of calculating capacity of the intelligent battery of the present invention will be described. FIG. 3 is a diagram showing circuit configuration of the intelligent battery and part of the system for implementing the method. In the example shown in FIG. 3, an intelligent battery 101 has the control circuit 106 comprised of the current measurement circuit 102, the voltage measurement circuit 103, a CPU 104 and a timer 105 and a battery 107. A system 111 such as a computer has an embedded controller 112 for controlling the keyboard and so on. The CPU 104 of the intelligent battery 101 and the embedded controller 112 of the system 111 can mutually transmit and receive data via a communication line 121. As a representative example of the system shown in FIG. 3, there is an SBS (Smart Battery System). An example of a method of implementing the present invention by using functions of the SBS and a protocol will be described hereafter.

In this example, the SBS is extended by using OptionalMfgFunction 1 (command code: hex3f (hexadecimal 3f)) that, among command sets of the SBS, can be freely defined by the user. FIG. 4 is a diagram showing an example of definition of OptionalMfgFunction 1. In FIG. 4, among the commands of 16 bits, the bits 15 to 14 show a power mode. As for the power mode, "00" shows a normal mode, "11" shows a soft-off mode, and "01" and "10" are undefined states. Moreover, as in an example mentioned later, it is possible, by considering a case of removing the battery 101 from the system 111, to define "10" of this power mode for instance as reconnection. In addition, of the commands of 16 bits, the bits 13 to 0 show the consumption electric current value while in the soft-off mode. The consumption electric current value is shown by a unit of a positive integer 1 as 0.1 mA, and the range of the value is from 0 mA to 1638.3 mA.

When the system 111 enters into the soft-off state, the controller 112 sends to the intelligent battery 101 word data shown in FIG. 4 together with the command code hex3f (hexadecimal 3f). It sets "11" to the bits 15 to 14 of the word data to show that it enters into the soft-off state, and it sets to the bits 13 to 0 a consumption electric current value of the soft-off state unique to the system 111. The consumption electric current value unique to the system 111 is acquired for the same system 111 in advance. For instance, if a consumption current in the soft-off state is 3.0 mA, it sets "00 0000 0001 1110" to the bits 13 to 0 and sets (hexc01e) as the entire word data.

The intelligent battery 101 that received the command code and word data can know that it has entered into a system off state and the consumption electric current value while in the soft-off mode. After entering into the soft-off state, the intelligent battery 101 subtracts the consumption electric current value of the system 111 while in the soft-off mode from the capacity data (mAh) for each hour so as to manage capacity of the intelligent battery 101. It starts the system 111 and enters into the normal performance from the soft-off state, and then the controller 112 of the system 111 sends to the intelligent battery 101 the command code hex3f and the word data hex0000 (the bits 15, 14 are "00" because they are the normal mode, and the bits 13 to 0 are "00 0000 0000 0000" because they are not used in the normal mode). If the intelligent battery 101 receives the command code and the word data showing that it has returned to the normal mode, it performs ordinary battery capacity management by using the current measurement circuit 102 and the voltage measurement circuit 103 to detect current and voltage values.

The problem arising here is a case of the intelligent battery 101 being removed from the system 111 while in the soft-off mode. An example of that case will be described hereafter. It is possible to detect whether it was removed from the system 111 by monitoring an IN terminal (A/D terminal) of the CPU 104. To be more specific, when the system 111 is connected, a voltage that is a constant voltage Vcc inside the system divided by R9 and resistance of a thermistor TH1 is inputted to the IN terminal. First, if the CPU 104 of the intelligent battery 101 detects that the intelligent battery 101 was removed from the system 111, it stops capacity subtraction while in the soft-off mode.

Next, as an example of the cases where the intelligent battery 101 is reconnected to the system 111 in the soft-off state, if it is in the soft-off state and without an AC adapter placed, it can neither determine whether this system 111 is the same as the previous system 111 nor communicate. In this case, the CPU 104 of the intelligent battery 101 counts the time from the reconnection to the system 111 in the soft-off state. Next, if the system 111 is powered up or the AC adapter is placed, first, the controller 112 of the system 111 sends to the intelligent battery 101 a notice that it was reconnected and the consumption electric current value of the system 111 while in the soft-off mode. To be more specific, it sends to the intelligent battery 101 the command code hex3f and the word data hex801e (the bits 15, 14 are "10" indicating reconnection, and the bits 13 to 0 are "00 0000 0001 1110" indicating the consumption electric current value 3.0 mA of the reconnected system 111). The intelligent battery 101 can immediately calculate correct battery capacity by acquiring and subtracting the capacity that could not be subtracted from the consumption electric current value while in the soft-off mode since the reconnection and the time counted from reconnection.

Next, on the shift of the system 111 from the soft-off state to the normal mode, the controller 112 of the system 111 sends to the intelligent battery 101 a notice of shifting to the normal operational mode by sending the command code hex3f and the word data hex0000 as in the above-mentioned example. Simultaneously, it stops subtraction of capacity data based on the consumption electric current value in the soft-off state, and enables and resumes capacity calculation by the current measurement circuit 102 on the other hand.

In addition, as another example of the case of connecting the intelligent battery 101 to the system 111 in the soft-off state again, in the case where the AC adapter is placed in spite of the soft-off state, it cannot determine whether this system 111 is the same as the previous system 111 but it can communicate. In this case, the controller 112 of the system 111 notifies the intelligent battery 101 that it was reconnected and the consumption electric current value of the system 111 in the soft-off state by sending the command code hex3f and the word data hex801e as in the above-mentioned example. The intelligent battery 101 resumes subtraction of capacity data based on the received consumption electric current value in the soft-off state, and disables capacity calculation by the current measurement circuit 102 on the other hand Next, when the system 111 shifts from the soft-off state to the normal operational mode, the controller 112 of the system 111 notifies the intelligent battery 101 that it shifts to the normal operational mode by sending the command code hex3f and the word data hex0000. Simultaneously, it stops subtraction of capacity data based on the consumption electric current value in the soft-off state, and enables and resumes capacity calculation by the current measurement circuit 102 on the other hand.

Moreover, while the above-mentioned example showed a case where communication between the system and the intelligent battery is performed by using the command sets of the SBS, the same can also be achieved by using a system or command sets other than the SBS. In addition, while the above-mentioned example described the soft-off state required by the ACPI as an instance, the present invention is also applicable to battery capacity calculation in a suspended state wherein power consumption such as 20 mA or less and lower consumption of electric power are demanded in recent years.

Furthermore, while the above-mentioned example showed a case where capacity data to be subtracted on low power consumption is calculated and acquired on the intelligent battery 101 side, it is also possible to configure it so that the capacity data to be subtracted is calculated on the system 111 side and sent to the intelligent battery 101 side.

In that case, first, when the system 111 shifts from the normal operational mode to the low electric power consumption mode, consumption battery capacity data assumed to have been spent during the low electric power consumption mode is calculated on the system 111 side based on the consumption electric current value or consumption electric power value in the low electric power consumption mode unique to the system 111. Next, the system 111 side sends a notice of shifting to the low electric power consumption mode and the consumption battery capacity data to the intelligent battery 101 side. On the intelligent battery 101 side, it calculates current battery capacity based on the received consumption battery capacity data, and disables capacity calculation by the current measurement circuit 102 on the other hand. Incidentally, when the system 111 shifts from the low electric power consumption mode to the normal operational mode, the system 111 side sends to the intelligent battery 101 side a notice of shifting to the normal operational mode and also stops capacity calculation based on the consumption battery capacity data. Simultaneously, it enables capacity calculation by the current measurement circuit 102. It is possible as above to configure it so as to calculate the capacity data to be subtracted on the system 111 side and send it to the intelligent battery 101 side.

Furthermore, in the preferred embodiment of the present invention, while the capacity data to be subtracted is acquired by setting a unit of the capacity data as an amount of charge (mAh) and sending the current value (mA) in the low electric power consumption mode as a fixed value, it is possible as another method to manage the unit of the capacity data as electric energy (mWh). In this case, the electric power value (mW) or the electric current value (mA) is sent as a fixed value in the low electric power consumption mode. In the case of setting the electric power value as the fixed value, correct capacity data (electric energy) can be acquired by subtracting (electric power x elapsed time) from the electric energy. In the case of setting the electric current value as the fixed value, correct capacity data (electric energy) can be acquired by subtracting (electric current value x voltage value x elapsed time) from the capacity data. The voltage value in this case means the voltage value measured by the voltage measurement circuit 103 inside the intelligent battery 101.

As it is apparent from the above description, according to the present invention, the power consumption in the low electric power consumption mode such as while in the soft-off mode is calculated based on the power consumption acquired by multiplying the consumption electric current in the low electric power consumption mode acquired in advance by the time that the mode continues rather than the power consumption based on the electric current value measured by the current measurement circuit of the battery itself, and so it allows the power consumption in the low electric power consumption mode to be calculated correctly so as to make the error of the acquired capacity data smaller.

What is claimed is:

1. A method of calculating capacity of an intelligent battery equipped with a current measurement circuit to measure an electric current value on which calculation of battery capacity is based, comprising the steps of:

(a) sending, from a system to an SBS-compliant intelligent battery, a notice that it shifts to a low electric power consumption mode, and a consumption electric current value or a consumption electric power value in the low electric power consumption mode unique to the system, when the system using the intelligent battery shifts from a normal operational mode to the low electric power consumption mode, the notice being defined in at least one command selected from among OptionalMfgFunction1 to OptionalMfgFunction5 of SBS;

(b) performing subtraction of capacity data of the intelligent battery based on the received consumption electric current value or consumption electric power value in the low electric power consumption mode, and disabling capacity calculation by the current measurement circuit;

(c) sending, from the system to the intelligent battery, a notice of shifting to the normal operational mode, and stopping the subtraction of capacity data based on the consumption electric current value or consumption electric power value in the low electric power consumption mode, and enabling capacity calculation by the current measurement circuit, when the system using the intelligent battery shifts from the low electric power consumption mode to the normal operational mode.

2. The method of calculating capacity of an intelligent battery according to claim 1, wherein said low electric power consumption mode is a soft-off state or a suspended state.

3. The method of calculating capacity of an intelligent battery according to claim 1,
wherein, in the low electric power consumption mode:

(a) on detecting that the intelligent battery is drawn out of the system, the subtraction of capacity data based on the received consumption electric current value or consumption electric power value in the low electric power consumption mode is stopped;

(b) next, on detecting that the intelligent battery is connected to the system, the battery counts time from the connection; and (c) when the system using the intelligent battery shifts from the low electric power consumption mode to the normal operational mode:
  (i) the system sends a notice is sent to the effect that it is reconnected to the intelligent battery and also sends the consumption electric current value or consumption electric power value in the low electric power consumption mode unique to the system;
  (ii) capacity to be subtracted from reconnection is calculated from the received consumption electric current value or consumption electric power value and the counted time, and the calculated capacity to be subtracted is subtracted from the capacity data; and (d) next, a notice is sent from the system to the intelligent battery to the effect that it shifts to the normal operational mod and also the subtraction of capacity data based on the consumption electric current value or consumption electric power value in the low electric power consumption mode is stopped, and capacity calculation by the current measurement circuit is enabled on the other hand.

4. The method of calculating capacity of an intelligent battery according to claim 1,
wherein, in the low electric power consumption mode:

(a) on detecting that the intelligent battery is drawn out of the system, that the intelligent battery stops the subtraction of capacity data based on the consumption electric current value or consumption electric power value received in the low electric power consumption mode;

(b) next, on detecting that the intelligent battery is connected to the system:
  (i) the system recognizing the connection sends a notice to the effect that it is reconnected to the intelligent battery and also sends the consumption electric current value or consumption electric power value in the low electric power consumption mode unique to the system;
  (ii) the intelligent battery resumes subtraction of capacity data based on the received consumption electric current value or consumption electric power value in the low electric power consumption mode, and disables capacity calculation by the current measurement circuit on the other hand;

(c) when the system using the intelligent battery shifts from the low electric power consumption mode to the normal operational mode, the system sends a notice to the battery that it shifts to the normal operational mode and also stops the subtraction of capacity data based on the consumption electric current value or consumption electric power value in the low electric power consumption mode, and enables capacity calculation by the current measurement circuit on the other hand.

5. A portable electronic device, comprising:
(a) a first system component for operating with supplied electric power in the normal operational mode but not operating with no supplied electric power in the low electric power consumption mode;

(b) a second system component for operating with supplied electric power both in the normal operational mode and in the low electric power consumption mode; and (c) a controller for:
  (i) performing control to supply electric power to said first and second system components, and supply electric power to said second system component and stop supply of electric power to said first system component in, the low electric power consumption mode;
  (ii) when shifting from the normal operational mode to the low electric power consumption mode, sending to an SBS-compliant intelligent battery a notice of shifting to the low electric power consumption mode and also sending a consumption electric current value or a consumption electric power value unique to the system, the notice being defined in at least one command selected from among OptionalMfgFunction1 to OptionalMfgFunction5 of SBS, and
  (iii) when shifting from the low electric power consumption mode to the normal operational mode, sending from the system to the intelligent battery a notice of shifting to the normal operational mode; and said intelligent battery characterized by:
  (iv) in the low electric power consumption mode, performing subtraction of capacity data based on the received consumption electric current value or consumption electric power value in the mode, and disabling capacity calculation on the current measurement circuit on the other hand;
  (v) when shifting from the low electric power consumption mode to the normal operational mode, stopping the subtraction of capacity data based on the consumption electric current value or consumption electric power value in the low electric power consumption mode, and enabling capacity calculation by the current measurement circuit on the other hand.

6. A portable electronic device, comprising:
(a) a first system component for operating with supplied electric power in a normal operational mode but not operating with no supplied electric power in a low electric power consumption mode;

(b) a second system component for operating with supplied electric power both in the normal operational mode and in the low electric power consumption mode; and (c) a controller for:
  (i) performing control to supply electric power to said first and second system components, and supply electric power to said second system component and stop supply of electric power to said first system component in the low electric power consumption mode;
  (ii) when shifting from the normal operational mode to the low electric power consumption mode, sending from a system to an SBS-compliant intelligent battery a notice of shifting to the low electric power consumption mode and also sending consumption battery capacity data assumed to be consumed during the low electric power consumption mode based on a consumption electric current value or a consumption electric power value in the low electric power consumption mode unique to the second system component calculated on the system side, the notice being defined in at least one command selected from among OptionalMfgFunction1 to OptionalMfgFunction5 of SBS; and (iii) when shifting from the low electric power consumption mode to the normal operational mode, sending from the system to the intelligent battery a notice of shifting to the normal operational mode; and said intelligent battery characterized by:

(iv) performing subtraction of the capacity data based on the received consumption battery capacity data in the low electric power consumption mode, and disabling capacity calculation on the current measurement circuit on the other hand;

(v) when shifting from the low electric power consumption mode to the normal operational mode, stopping the subtraction of capacity data based on the consumption current capacity data in the low electric power consumption mode, and enabling capacity calculation by the current measurement circuit on the other hand.

* * * * *